United States Patent
Guan

(10) Patent No.: US 7,453,273 B1
(45) Date of Patent: Nov. 18, 2008

(54) METHOD AND APPARATUS FOR ANALYZING CURRENT IN AN INTEGRATED CIRCUIT UNDER TEST

(75) Inventor: James Guan, San Jose, CA (US)

(73) Assignee: XILINX, Inc., San Jose, CA (US)

(*) Notice: Subject to any disclaimer, the term of this patent is extended or adjusted under 35 U.S.C. 154(b) by 16 days.

(21) Appl. No.: 11/804,231

(22) Filed: May 16, 2007

(51) Int. Cl.
*G01R 31/302* (2006.01)
(52) U.S. Cl. ........................... 324/750; 324/753
(58) Field of Classification Search ............. None
See application file for complete search history.

(56) References Cited

U.S. PATENT DOCUMENTS 5,301,006 A * 4/1994 Bruce ................. 356/311
6,344,750 B1 * 2/2002 Lo et al. .............. 324/751
6,870,379 B1 * 3/2005 Davis et al. .......... 324/752

* cited by examiner

*Primary Examiner*—Minh N Tang
(74) *Attorney, Agent, or Firm*—Robert M. Brush

(57) ABSTRACT

Method and apparatus for analyzing current in an integrated circuit under test is described. In one example, an image from detected photon emissions from the integrated circuit is generated. A first intensity of the photon emissions at a first region in the image indicative of a first current having a known magnitude is determined. A second intensity of the photon emissions at a second region in the image indicative of a second current is determined. A magnitude of the second current is estimated from the first intensity, the second intensity, and the known magnitude of the first current.

20 Claims, 3 Drawing Sheets

METHOD AND APPARATUS FOR ANALYZING CURRENT IN AN INTEGRATED CIRCUIT UNDER TEST

FIELD OF THE INVENTION

One or more aspects of the present invention relate generally to semiconductor device testing and, more particularly, to a method and apparatus for analyzing current in an integrated circuit under test.

BACKGROUND OF THE INVENTION

The design and development of integrated circuits (ICs) involves extensive testing to ensure that the ICs function correctly. It is common for an IC to include many millions of individual transistors configured in various logical arrangements using interconnect wires. As new semiconductor manufacturing processes are developed, the physical sizes of the transistors are continually shrinking. For example, transistor gate lengths of 65 nanometers or smaller are becoming common. Furthermore, as each new semiconductor manufacturing process reduces feature sizes, transistor usage per IC die increases. Also, the cross-sections of the interconnect wires are reduced. In spite of the reduction in magnitude of typical operation current for an IC, the current density on the interconnect wires has increased. As such, the interconnect wires are at risk of being damaged.

There are some situations where the risk of damage to the interconnect wires is even greater. One such situation occurs when power is first applied to an IC. Some circuits may enter states that were not anticipated during design, causing other circuits to contend with one another. The current caused by such contending circuits is referred to as "contention current." Reduction or elimination of contention current is typically not considered during design of the IC. Such contention current, however, should be identified and controlled in order to reduce the risk of damage to the interconnect wires. Accordingly, there exists a need in the art for a method and apparatus for analyzing current, such as contention current, in an integrated circuit under test.

SUMMARY OF THE INVENTION

Method and apparatus for analyzing current in an integrated circuit under test is described. In one example, an image from detected photon emissions from the integrated circuit is generated. A first intensity of the photon emissions at a first region in the image indicative of a first current having a known magnitude is determined. A second intensity of the photon emissions at a second region in the image indicative of a second current is determined. A magnitude of the second current is estimated from the first intensity, the second intensity, and the known magnitude of the first current.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Figure 1:
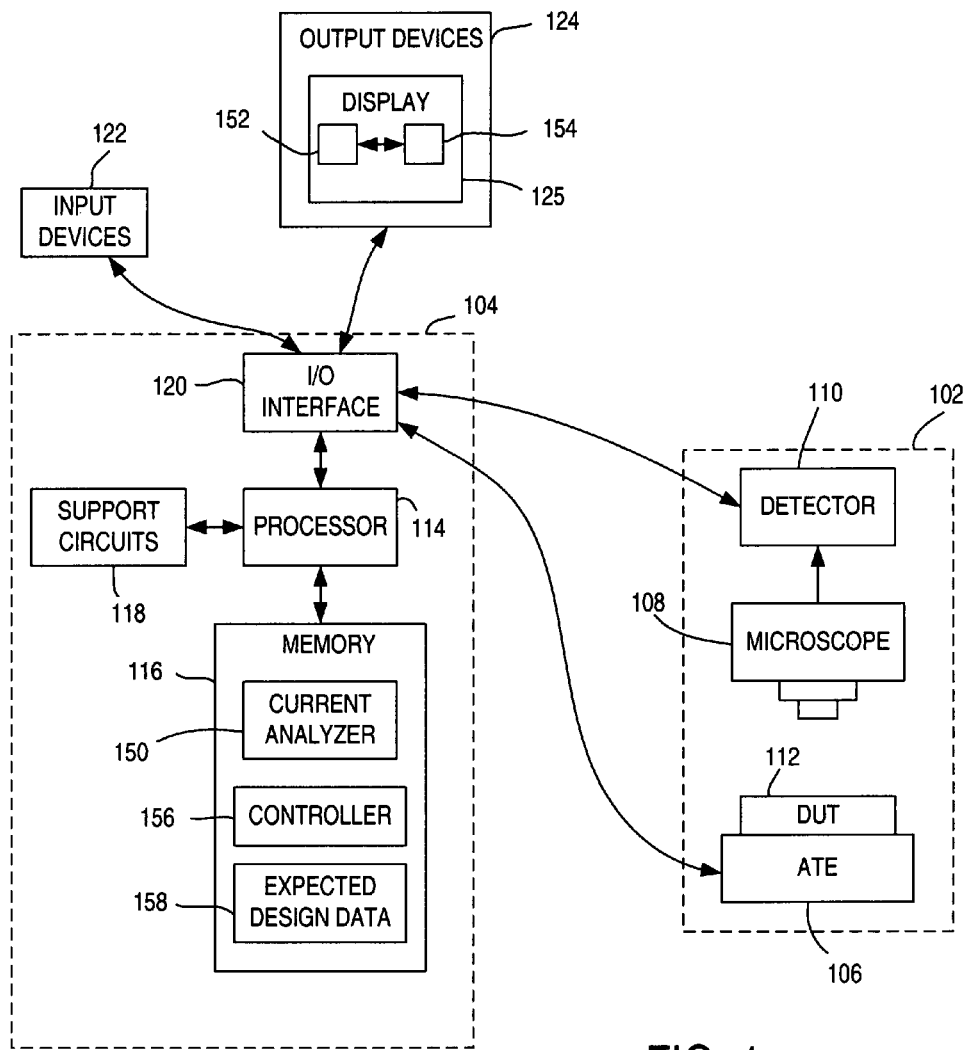
FIG. 1 is a block diagram depicting an exemplary embodiment of an integrated circuit (IC) testing system in accordance with one or more aspects of the invention.

FIG. 1 is a block diagram depicting an exemplary embodiment of an integrated circuit (IC) testing system 100 in accordance with one or more aspects of the invention. The system 100 includes a test unit 102 and a computer 104. The test unit 102 is configured to cooperate with the computer 104 to analyze one or more sources of current in a device under test (DUT) 112, such as sources of contention current. The DUT 112 may be an IC die or a wafer comprising a plurality of IC dice.

In particular, the computer 104 may include a processor 114, a memory 116, various support circuits 118, and an I/O interface 120. The processor 114 may include one or more microprocessors known in the art. The support circuits 118 for the processor 114 may include conventional cache, power supplies, clock circuits, data registers, I/O interfaces, and the like. The I/O interface 120 may be directly coupled to the memory 116 or coupled through the processor 114. The I/O interface 120 may be coupled to various input devices 122 (e.g., keyboard, mouse, and the like) and output devices 124, which may include a display 125. The I/O interface 120 is further coupled to the test unit 102, as described below.

The memory 116 stores processor-executable instructions and/or data that may be executed by and/or used by the processor 114. These processor-executable instructions may comprise hardware, firmware, software, and the like, or some combination thereof. Modules having processor-executable instructions that are stored in the memory 116 include a current analyzer 150 and a controller 156. The controller 156 is configured to control operational aspects of the test unit 102, including initiation of the test process, parameters to be used during the test process, collection of results of the test process, and the like. The current analyzer 150 is configured to analyze data produced by the test unit 102 to identify and estimate sources of currents in the DUT 112, such as sources of contention currents. Operation of the current analyzer 150 is described below. Although shown as module(s) being executed by the processor 114, the current analyzer 150 and/or controller 156 may be hardware, software, or a combination thereof. For example, the current analyzer 150 and/or controller 156 may be implemented using a programmable logic device (PLD), such as a field programmable gate array (FPGA), or an application specific integrated circuit (ASIC).

The computer 104 may be programmed with an operating system, which may be Windows, Unix, Linux, Solaris, HP UX, AIX, among other known platforms. At least a portion of an operating system may be disposed in the memory 116. The memory 116 may include one or more of the following random access memory, read only memory, magneto-resistive read/write memory, optical read/write memory, cache memory, magnetic read/write memory, and the like, as well as signal-bearing media as described below.

The test unit 102 is configured to detect photon emissions from the DUT 112. Switching events in complementary metal oxide semiconductor (CMOS) transistors may cause the emission of photons. When a CMOS logic gate switches state, a small amount of current must flow through the channel of at least one transistor to charge or discharge the drain connected to the output of the gate. For a very brief time, some of the current will flow in a very high field near the drain. The current flowing in the high electric field produces hot carriers, some of which may release energy by scattering, and possibly the emission of a photon. The photons have energies in the near infrared and visible spectrum. Notably, a silicon substrate is transparent to photons having near infrared wavelengths. CMOS logic elements through which currents flow are referred to as current sources or sources.

The test unit 102 includes automatic test equipment (ATE) 106, a microscope 108, and a detector 110. The ATE 106 is configured to electrically bias the DUT 112. That is, the ATE 106 applies one or more voltages to specified pins or pads of the DUT 112 such that the DUT 112 draws a current ("total current"). In some embodiments, the ATE 106 may also provide one or more input vectors, for example input vectors corresponding to a configuration bitstream that may be used to configure a programmable logic device such as a field programmable gate array. The I/O interface 120 of the computer 104 may be coupled to the ATE 106, which allows the controller 156 to control one or more aspects of the biasing process.

Photons emitted from the DUT 112 are collected by the microscope 108 and focused onto the detector 110. The microscope 108 includes various optical elements for collect and focusing the emitted photons, as is well known in the art. The microscope 108 focuses the emitted photons onto the detector 110. The detector 110 may comprise a charge coupled device (CCD) sensor, mercury cadmium telluride (MCT) sensor (also known as a MerCad sensor), indium gallium arsenide (InGaAs) sensor, or like type image sensor known in the art, or a combination of such image sensors. The detector 110 may include an array of sensors (or "pixels") for detecting photons. The detector 110 outputs a value for each of the pixels indicative of the intensity of the photons incident on the pixel over a period of time ("acquisition period"). The values corresponding to the pixels are referred to as "pixel values." Operation of various images sensors that can be used to implement the detector 110, including CCD, MCT, and InGaAs sensors described above, is well known in the art. The I/O interface 120 of the computer 104 is coupled to the detector 110, which allows the controller 156 to control one or more aspects of the detection process, including collection of the pixel values.

For purposes of clarity by way of example, the test unit 102 is shown as having a detector, a microscope, and ATE. Those skilled in the art will appreciate that the test unit 102 may comprise various other types of devices and equipment. The test unit 102 generally functions as an emission microscope for detecting photon emissions from a DUT, such emission microscopes being instruments well known in the art of semiconductor device testing. The test unit 102 may be implemented using any commercially available emission microscope, such as those manufactured by Credence Systems Corporation of Milpitas, Calif., or from Hamamatsu Photonics, K.K. of Hamamatsu City, Japan, for example. In general, the test unit 102 may comprise any type of instrument for exercising a DUT and collecting photon emission data therefrom.

The current analyzer 150 is configured to obtain the pixel values produced by the detector 110 via the I/O interface 120. The current analyzer 150 generates an image from the pixel values. That is, an image is generated from detected photon emissions from the DUT 112 ("photon emission image"). The photon emission image includes information indicative of the intensity of photon emissions for each of the pixels of the detector 110. The pixels of the detector 110 correspond to discrete regions of the DUT 112. That is, each pixel in the detector 110 detects photons emitted from a discrete region of the DUT 112. As such, the photon emission image includes information indicative of the photon emission intensity at various regions of the DUT 112.

The current analyzer 150 may present a photon emission image 152 to a user via the display 125. The user may employ the input devices 122 to interact with the current analyzer 150 to view the photon emission image 152. For example, the user may perform various operations with respect to the photon emission image 152, including zooming in, zooming out, panning, and the like. In addition, the current analyzer 150 may be configured to overlay the photon emission image 152 over an image of circuitry in the DUT 112 ("circuit image 154"). The computer 104 may obtain the circuit image 154 from the test unit 102, from some other test equipment (not shown), or from some other source. Overlaying the photon emission 152 image over the circuit image 154 allows the user to identity which regions (e.g., circuits) of the DUT 112 generated the photon emissions.

As described above, the ATE 106 provides current to the DUT 112 during the acquisition period. The total current supplied to the DUT 112 may include both intentional current and contention current. Notably, some portion (the intentional or expected current) of the total current is expected by the user based on the circuit design of the DUT 112. For example, the circuit design may have been simulated during the design process, yielding an expected total current drawn by the DUT 112. Also, the simulation process may yield expected currents for various individual sources in the design. This data is generally referred to as expected design data 158. If the DUT 112 sinks more total current during the testing process than expected, the remaining portion may be due to contention among devices (i.e., contention current). The total contention current drawn by the DUT 112 may be determined in this manner. As described below, the current analyzer 150 is configured to identify particular sources of contention currents and estimate the magnitude of such contention currents within the DUT 112.

A source of current in the DUT 112 may generate photon emissions, as described above. As such, the photon emissions recorded in the image correspond to particular current sources within the DUT 112. A photon emission corresponding to a current source in the DUT 112 is referred to as an "emission spot." In other words, the photon emission image includes one or more emission spots corresponding with one or more current sources, respectively. An emission spot is also generally referred to as a "region" in the photon emission image 152.

The currents that generate the emission spots may either be intentional currents or contention currents. Since intentional currents are known by the user, the regions of the DUT 112 that source these intentional currents are also known. As such, particular emission spots corresponding to the intentional currents can be identified. In some embodiments, the user may interact with the current analyzer 150 using the input devices 122 to identify emission spots corresponding to intentional currents. In other embodiments, the current analyzer 150 obtains information indicative of the sources of intentional current (e.g., from a simulation of the DUT 112) and automatically identifies emission spots associated with the intentional currents.

The remaining emission spots may be due to contention currents. In some embodiments, the user may interact with the current analyzer 150 using the input devices 122 to identify emission spots corresponding to contention currents. In other embodiments, the current analyzer 150 automatically identifies the emission spots associated with the contention currents given known sources of intentional current (e.g., from a simulation of the DUT 112).

Figure 2:
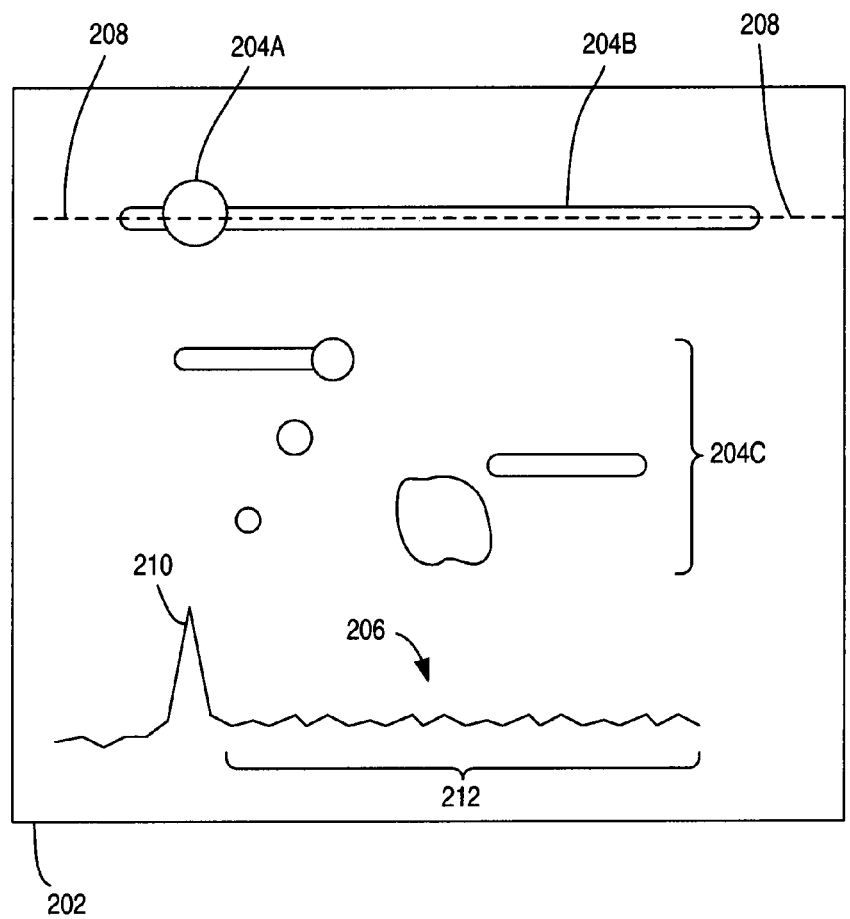
FIG. 2 illustrates an exemplary embodiment of a photon emission image in accordance with one or more aspects of the invention.

For example, FIG. 2 illustrates an exemplary embodiment of a photon emission image 202 in accordance with one or more aspects of the invention. For clarity, the photon emission image 202 as shown does not overlay a circuit image of the DUT 112. The photon emission image 202 includes a plurality of emission spots, including emission spot 204A, emission spot 204B, and emission spots 204C (emission spots generally referred to as emission spots 204). In the present example, the emission spot 204A and the emission spots 204C correspond to intentional currents within the DUT 112. The emission spot 204B corresponds to a contention current within the DUT 112.

In the present embodiment, the photon emission image 202 includes photon intensity information expressed in plot 206 for the emission spots along line 208, namely, the emission spot 204A and the emission spot 204B. As shown in the plot 206, the emission spot 204A has a higher intensity (as shown by peak 210) as compared to the emission spot 204B (as shown by portion 212). The user may view different intensity information for other emission spots by selecting and moving the line 208. Those skilled in the art will appreciate that intensity may be shown using mechanisms other than the plot 206, such as by varying the color of the emission spots 204.

While the total contention current may be known, it is useful to determine the magnitude of individual contention currents within the DUT 112 generated by particular sources. The current analyzer 150 is configured to estimate the magnitude of a given contention current. First, the current analyzer 150 determines a ratio between a magnitude of an intentional current and the intensity of photon emissions generated by the intentional current as measured in the photon emission image 152. That is, if an intentional current is $I_{in}$, and the intensity of photon emissions due to the current $I_{in}$ is $P_{in}$, then the current analyzer 150 determines $I_{in}/P_{in}$. The current analyzer 150 may compute this ratio for one or more intentional currents in the DUT 112. In case of multiple ratios, an average ratio may be computed.

The ratio $I_{in}/P_{in}$ is equal to the ratio of a magnitude of a contention current to the intensity of photon emissions generated by the contention current as measured in the photon emission image 152. That is, if a contention current is $I_{con}$, and the intensity of the photon emissions due to the current $I_{con}$ is $P_{con}$, then $I_{in}/P_{in}=I_{con}/P_{con}$. The current analyzer 150 may determine the intensity of a contention current, $P_{con}$, from the photon emission image 152. As such, the current analyzer 150 may compute an estimate of the magnitude of the contention current in accordance with the following: $I_{con}=(I_{in}/P_{in})*P_{con}$. Using this equality, the current analyzer 150 may estimate the magnitude of any contention current identified in the photon emission image 152. As described above, sources of contention currents may be automatically identified by the current analyzer 150, or identified by the user.

Although the current analyzer 150 has been described as analyzing contention current, it is to be understood that the current analyzer 150 may analyze other types of currents from various sources, such as leakage currents, currents due to short circuits, floating gate currents, and the like. All that is required is the magnitude of a known current (e.g., intentional current) and the photon emission image.

Figure 3:
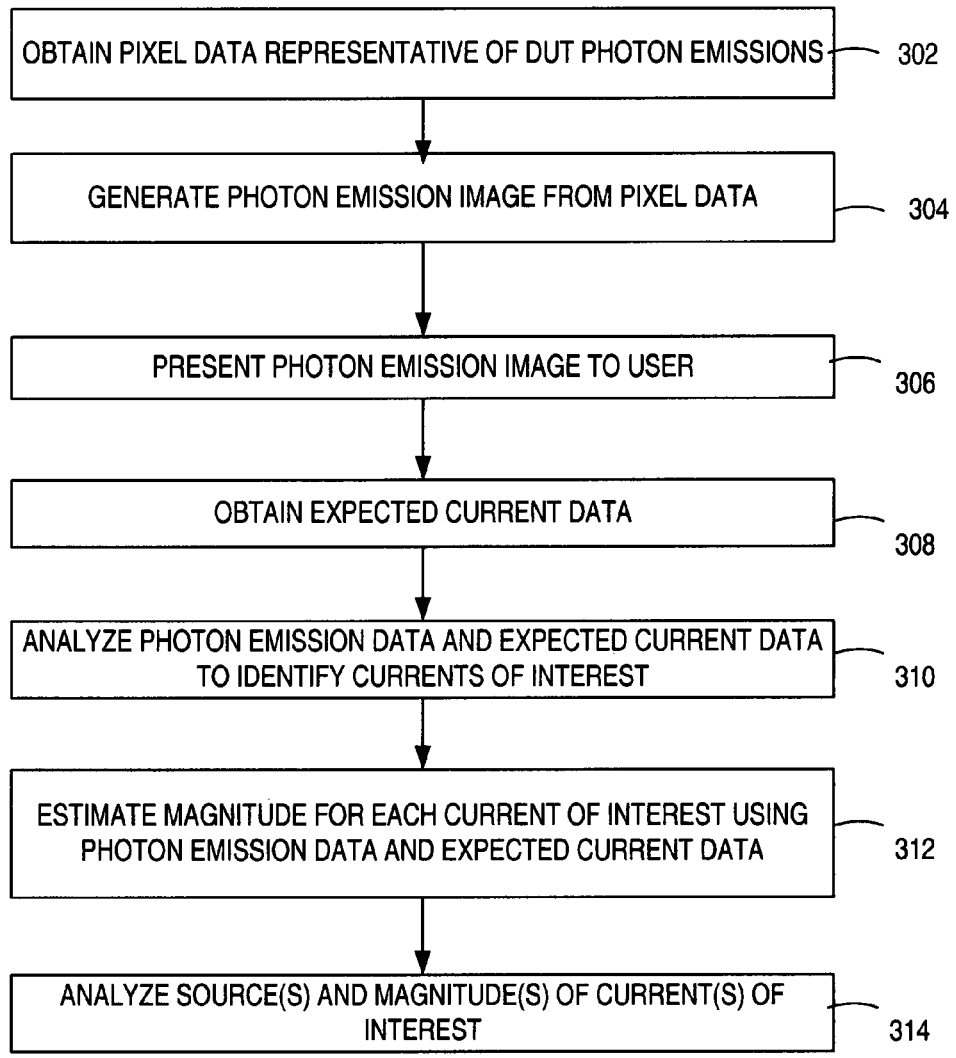
FIG. 3 is a flow diagram depicting an exemplary embodiment of a method for analyzing current in an integrated circuit under test in accordance with one or more aspects of the invention.

FIG. 3 is a flow diagram depicting an exemplary embodiment of a method 300 for analyzing current in an integrated circuit under test in accordance with one or more aspects of the invention. The method 300 begins at step 302, where pixel data is obtained representative of photon emissions of a DUT. As described above, the pixel data may be obtained from a test instrument, such as an emission microscope. At step 304, a photon emission image is generated from the pixel data. The photon emission image includes information indicative of location of the photon emissions with respect to the DUT (e.g., sources/circuits in the DUT), as well as the intensity of such photon emissions.

At step 306, the photon emission image may be presented to a user. The photon emission image may be overlaid on a circuit image of the DUT. At step 308, data indicative of expected current in the DUT is received (i.e., intentional current). As described above, expected current data may be obtained from simulations of the DUT. At step 310, the photon emission image and expected current data are analyzed to identify one or more currents of interest. A current of interest may be a contention current, leakage current, or the like as described above. The current(s) of interest may be identified automatically based on the photon emission data and the expected current data. For example, the expected current data is used to identify sources of the expected current on the DUT. Emission spots in the photon emission data that correspond with these sources are identified as being generated by expected current. Other emission spots in the photon emission data that do no correspond to sources of expected current may be identified as sources of interest. Alternatively, the currents of interest may be obtained through interaction with the user.

At step 312, magnitudes for the currents of interest are determined using the photon emission data and the expected current data. For example, as described above, the ratio of known current magnitude to intensity of photon emissions for the known current is multiplied by intensity of photon emissions for a current of interest to estimate the magnitude of such current of interest. At step 314, the sources and magnitudes of the currents of interest are analyzed. For example, by determining individual sources of unexpected currents, such as contention currents, the user may make more informed decisions with respect to whether the DUT design should be modified and, if so, how the DUT design should be modified to reduce or eliminate such unexpected current.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

What is claimed is:

1. A method of analyzing current in an integrated circuit under test, comprising:
   generating an image from detected photon emissions from the integrated circuit;
   determining a first intensity of the photon emissions at a first region in the image indicative of a first current having a known magnitude;
   determining a second intensity of the photon emissions at a second region in the image indicative of a second current; and
   estimating a magnitude of the second current from the first intensity, the second intensity, and the known magnitude of the first current.

2. The method of claim 1, further comprising:
   identifying a source of the second current based on the second region in the image.

3. The method of claim 2, wherein the first current comprises an intentional current and the second current comprises a contention current.

4. The method of claim 3, further comprising:
analyzing the source of the contention current and the magnitude of the contention current within the design of the integrated circuit under test.

5. The method of claim 1, wherein the step of estimating comprises:
computing a product between the known magnitude of the first current and a ratio of the second intensity to the first intensity.

6. The method of claim 1, wherein the step of generating comprises:
detecting photon emissions over an acquisition period using an emission microscope.

7. The method of claim 1, wherein the first intensity and the second intensity are determined from values of pixels in the image.

8. Apparatus for analyzing current in an integrated circuit under test, comprising:
means for generating an image from detected photon emissions from the integrated circuit;
means for determining a first intensity of the photon emissions at a first region in the image indicative of a first current having a known magnitude;
means for determining a second intensity of the photon emissions at a second region in the image indicative of a second current; and
means for estimating a magnitude of the second current from the first intensity, the second intensity, and the known magnitude of the first current.

9. The apparatus of claim 8, further comprising:
means for identifying a source of the second current based on the second region in the image.

10. The apparatus of claim 9, wherein the first current comprises an intentional current and the second current comprises a contention current.

11. The apparatus of claim 10, further comprising:
means for analyzing the source of the contention current and the magnitude of the contention current within the design of the integrated circuit under test.

12. The apparatus of claim 8, wherein the means for estimating comprises:
means for computing a product between the known magnitude of the first current and a ratio of the second intensity to the first intensity.

13. The apparatus of claim 8, wherein the means for generating comprises:
means for detecting photon emissions over an acquisition period using an emission microscope.

14. The apparatus of claim 8, wherein the first intensity and the second intensity are determined from values of pixels in the image.

15. A system for testing an integrated circuit, comprising:
a test unit configured to electrically bias the integrated circuit and capture photon emissions from the integrated circuit in response to the bias; and
a computer, coupled to the test unit, configured to:
generate an image from the photon emissions;
determine a first intensity of the photon emissions at a first region in the image indicative of a first current having a known magnitude;
determine a second intensity of the photon emissions at a second region in the image indicative of a second current; and
estimate a magnitude of the second current from the first intensity, the second intensity, and the known magnitude of the first current.

16. The system of claim 15, wherein the computer is further configured to:
identify a source of the second current based on the second region in the image.

17. The system of claim 16, wherein the first current comprises an intentional current and the second current comprises a contention current.

18. The system of claim 15, wherein the computer is configured to estimate the magnitude of the second current by computing a product between the known magnitude of the first current and a ratio of the second intensity to the first intensity.

19. The system of claim 15, wherein the test unit is configured to detect the photon emissions over an acquisition period using an emission microscope.

20. The system of claim 15, wherein the first intensity and the second intensity are determined from values of pixels in the image.

* * * * *